United States Patent
Chen et al.

(10) Patent No.: US 12,125,889 B2
(45) Date of Patent: Oct. 22, 2024

(54) SOURCE/DRAIN CONTACT WITH LOW-K CONTACT ETCH STOP LAYER AND METHOD OF FABRICATING THEREOF

(71) Applicant: Taiwan Semiconductor Manufacturing Co., Ltd., Hsinchu (TW)

(72) Inventors: Ting-Yeh Chen, Hsinchu (TW); Wei-Yang Lee, Taipei (TW); Chia-Pin Lin, Hsinchu County (TW); Da-Wen Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 349 days.

(21) Appl. No.: 17/465,665

(22) Filed: Sep. 2, 2021

(65) Prior Publication Data
US 2022/0285513 A1    Sep. 8, 2022

Related U.S. Application Data

(60) Provisional application No. 63/157,165, filed on Mar. 5, 2021.

(51) Int. Cl.
*H01L 29/423*    (2006.01)
*H01L 21/8234*   (2006.01)
(Continued)

(52) U.S. Cl.
CPC ............ *H01L 29/42392* (2013.01); *H01L 21/823418* (2013.01); *H01L 21/823468* (2013.01);
(Continued)

(58) Field of Classification Search
CPC ......... H01L 21/02603; H01L 21/28141; H01L 21/823418; H01L 21/823431; H01L 21/823468; H01L 21/823821; H01L 21/845; H01L 27/0886; H01L 27/0924; H01L 27/1211; H01L 29/0653; H01L 29/0665; H01L 29/0673; H01L 29/41791; H01L 29/42392; H01L 29/66439; H01L 29/6653; H01L 29/66553; H01L 29/6656; H01L 29/66636; H01L 29/66742; H01L 29/66795; H01L 29/775; H01L 29/7848;
(Continued)

(56) References Cited

U.S. PATENT DOCUMENTS 8,796,666 B1    8/2014  Huang et al.
8,822,243 B2    9/2014  Yan et al.
(Continued)

*Primary Examiner* — David C Spalla
(74) *Attorney, Agent, or Firm* — HAYNES AND BOONE, LLP

(57) ABSTRACT

Gate spacer that improves performance and methods for fabricating such are disclosed herein. An exemplary device includes a gate stack disposed over a semiconductor layer and a gate spacer disposed on a sidewall of the gate stack. A source/drain feature is disposed in the semiconductor layer and adjacent the gate spacer. A low-k contact etch stop layer is disposed on a top surface and a sidewall of the gate spacer and a portion of the gate spacer is disposed between the low-k contact etch stop layer and the semiconductor layer. A source/drain contact is disposed on the source/drain feature and adjacent the low-k contact etch stop layer.

20 Claims, 9 Drawing Sheets

(51) Int. Cl.
  *H01L 29/06* (2006.01)
  *H01L 29/66* (2006.01)
  *H01L 29/786* (2006.01)

(52) U.S. Cl.
  CPC ...... *H01L 29/0665* (2013.01); *H01L 29/6656* (2013.01); *H01L 29/66742* (2013.01); *H01L 29/78618* (2013.01); *H01L 29/78696* (2013.01)

(58) Field of Classification Search
  CPC ............... H01L 29/785; H01L 29/7851; H01L 29/7853; H01L 29/7855; H01L 29/78618; H01L 29/78696; H01L 2029/7858
  See application file for complete search history.

(56) References Cited

U.S. PATENT DOCUMENTS

| | | |
|---|---|---|
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 2016/0343858 A1* | 11/2016 | Kim ................ H01L 21/823468 |
| 2018/0323107 A1* | 11/2018 | Zhou ..................... H01L 21/266 |
| 2019/0165185 A1* | 5/2019 | Chang ................ H01L 29/0847 |
| 2020/0044043 A1* | 2/2020 | Hsu ................... H01L 21/02216 |

\* cited by examiner

SOURCE/DRAIN CONTACT WITH LOW-K CONTACT ETCH STOP LAYER AND METHOD OF FABRICATING THEREOF

CROSS-REFERENCE TO RELATED APPLICATION

The present application claims the benefit of U.S. Provisional Patent Application Ser. No. 63/157,165, filed on Mar. 5, 2021, which is incorporated herein by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

For example, as fin-like field effect transistor (FinFET) technologies progress towards smaller feature sizes (such as 32 nanometers, 28 nanometers, 20 nanometers, and below), advanced techniques are needed for improving performance of FinFET devices as smaller feature sizes are used. Although existing FinFET source/drain contact formation techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
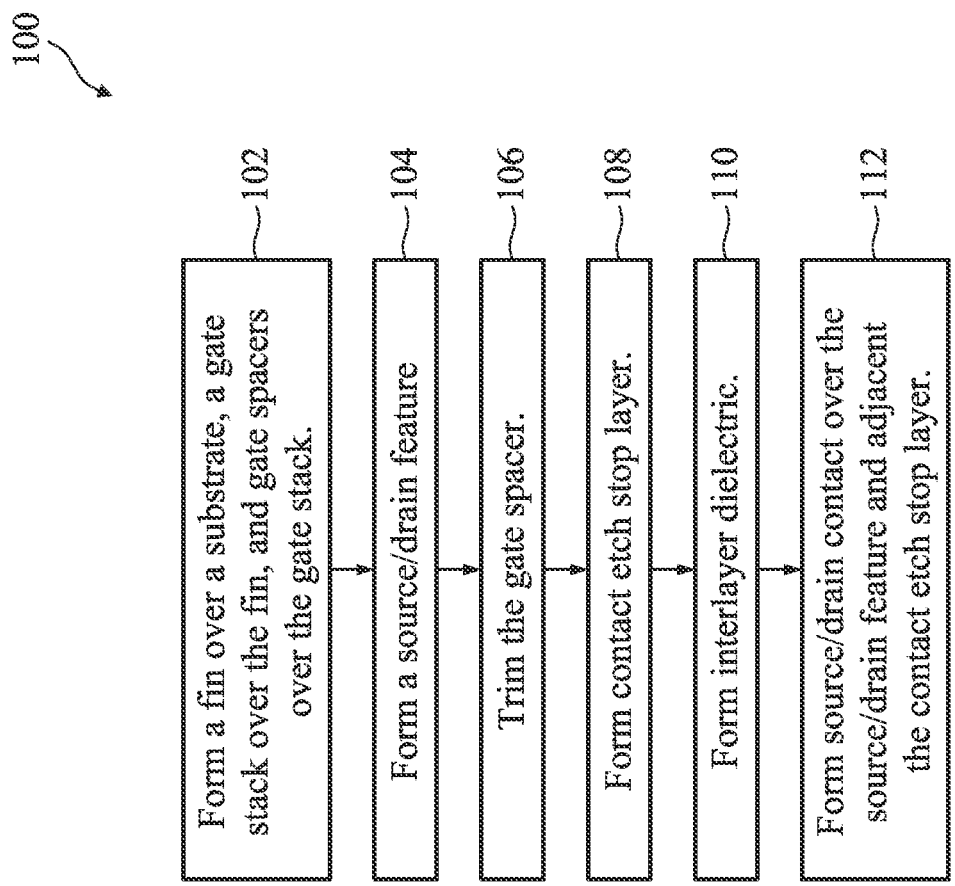
FIG. 1 is a flow chart of a method for fabricating a semiconductor device according to various aspects of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

FIG. 1 is a flow chart of a method 100 for fabricating a semiconductor device according to various aspects of the present disclosure. At block 102, form a gate stack over a channel region of a semiconductor device and gate spacers along sidewalls of the gate stack. In some embodiments, the gate stack may be disposed over a channel region of a fin of a FinFET. In some embodiments, the gate stack may be disposed over a channel layer (e.g., nanowires, nanosheets, nanobars, nanostructure, and/or other channel suspended over a substrate) of a gate all around (GAA) device. At block 104, form an epitaxial source/drain feature in a source/drain region of the semiconductor device that is adjacent to the channel region. At block 106, trim at least one of the gate spacers above the epitaxial source/drain feature. At block 108, deposit a contact etch stop layer (CESL) over the sidewalls and on tops of the remaining portions of the gate spacers. The CESL replaces portions of the gate spacers that were removed during the trim process. At block 110, deposit an interlayer dielectric material over the gate stack, the CESL, and the epitaxial source/drain feature. At block 112, form a source/drain contact over the source/drain feature and adjacent the CESL. In some embodiments, the source/drain contact physically contacts the CESL.

FIGS. 2A-2F are diagrammatic cross-sectional views of a semiconductor device 200 at various stages of fabrication (such as those associated with method 100 in FIG. 1) according to various aspects of the present disclosure. Semiconductor device 200 may be included in a microprocessor, a memory, and/or other IC device. In some embodiments, semiconductor device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIG. 2A-2F have been simplified for the sake of clarity to better understand the inventive concepts of the present disclosure. Additional features can be added in semiconductor device 200, and some of the features described below can be replaced, modified, or eliminated in other embodiments of semiconductor device 200.

Figure 2A:
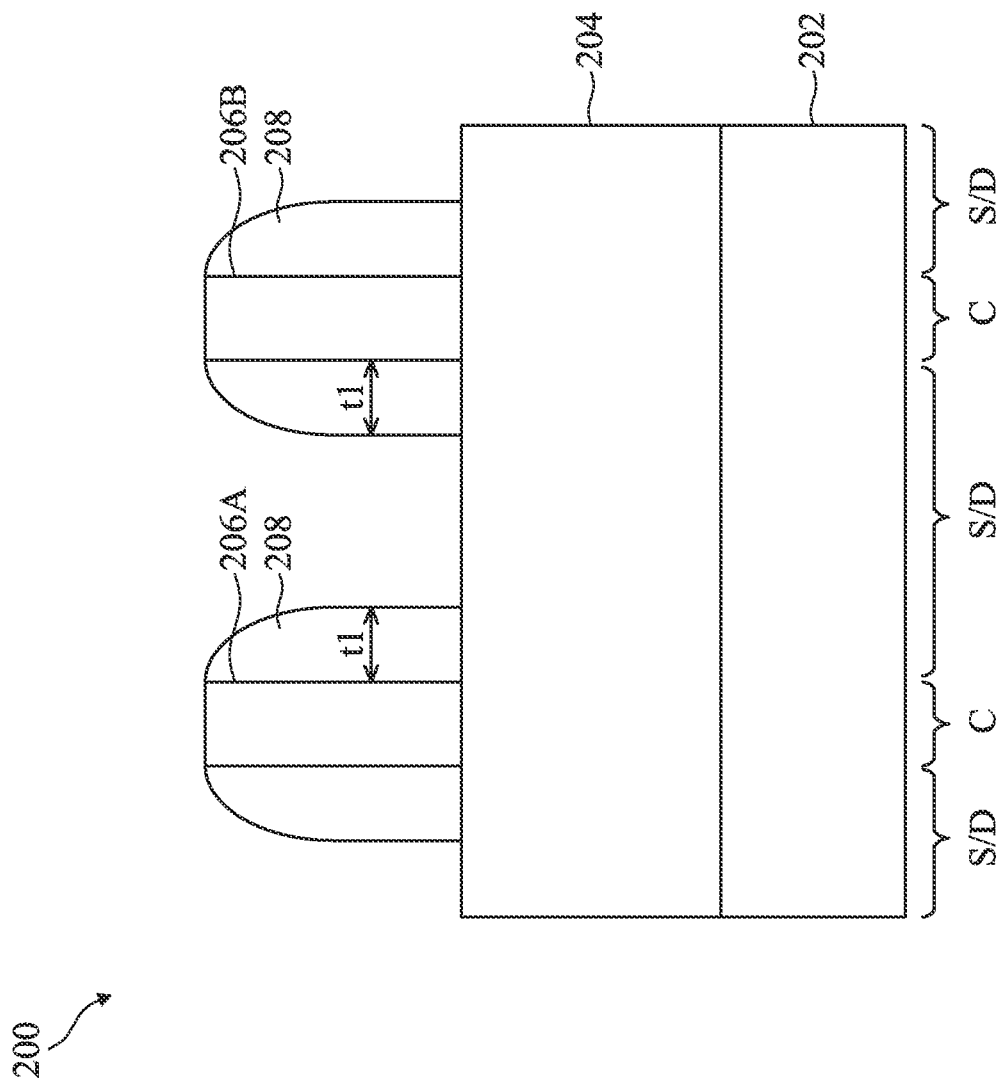
FIGS. 2A-2F are diagrammatic cross-sectional views of a semiconductor device at various fabrication stages (such as those associated with the method of FIG. 1) according to various aspects of the present disclosure

Turning to FIG. 2A, semiconductor device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of semiconductor device 200. For example, substrate 202 can include a p-type doped region (referred to as a p-well), which can be configured for an n-type transistor, and an n-type doped region (referred to as an n-well), which can be configured for a p-type transistor. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions of semiconductor device 200.

A fin 204 is formed over substrate 202. In some embodiments, fin 204 extending from substrate 202 may be a portion of a FinFET. Fin 204 may have a length defined in a y-direction, a width defined in an x-direction, and a height defined in a z-direction. In some embodiments, fin 204 may be suspended semiconductor layers (e.g., nanowires, nanosheets, nanobars, nanostructure, and/or other channel structure suspended over a substrate) of a GAA device formed over substrate 202. The present disclosure contemplates embodiments including multiple fins 204 (e.g., FinFET, GAA device) formed over substrate 202. Fin 204 has at least one channel region (C), at least one source region (S/D), and at least one drain region (S/D) defined along its length, where the channel region is disposed between the source region and the drain region, both of which are collectively referred to as source/drain (S/D) regions. In some embodiments, fin 204 is a portion of substrate 202. For example, in the depicted embodiment, where substrate 202 includes silicon, fin 204 includes silicon. Alternatively, fin 204 is a material layer, such as a semiconductor material layer, disposed on substrate 202. The semiconductor material may be silicon, germanium, silicon germanium, III-V semiconductor material, other suitable semiconductor material, or combinations thereof. In some embodiments, fin 204 includes a stack of semiconductor layers (e.g., GAA device) disposed over substrate 202. The semiconductor layers can include same or different materials, dopants, etching rates, constituent atomic percentages, constituent weight percentages, thicknesses, and/or configurations depending on design requirements of semiconductor device 200.

A combination of deposition, lithography, and/or etching processes are performed to form fin 204 extending from substrate 202. For example, forming fin 204 includes performing a lithography process to form a patterned mask layer over substrate 202 (or a material layer disposed over substrate 202) and performing an etching process to transfer a pattern formed in the patterned mask layer to substrate 202 (or the material layer). The lithography process can include forming a resist layer over substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. In some embodiments, the patterned resist layer is the patterned mask layer. In such embodiments, the patterned resist layer is used as an etch mask to remove portions of substrate 202 (or the material layer). In some embodiments, the patterned resist layer is formed over a mask layer formed over substrate 202 before forming the resist layer, and the patterned resist layer is used as an etch mask to remove portions of the mask layer formed over substrate 202. In such embodiments, the patterned mask layer is used as an etch mask to remove portions of substrate 202 (or the material layer). The etching process can include a dry etching process, a wet etching process, other suitable etching process, or combinations thereof. In some embodiments, a reactive ion etching (RIE) process is used to form fin 204. After the etching process, the patterned resist layer is removed from substrate 202, for example, by a resist stripping process. In some embodiments, after the etching process, patterned mask layer is removed from substrate 202 (in some embodiments, by a resist stripping process). In some embodiments, the patterned mask layer is removed during etching of substrate 202 (or the material layer). Alternatively, fin 204 is formed by a multiple patterning process, such as a double patterning lithography (DPL) process (for example, a lithography-etch-lithography-etch (LELE) process, a self-aligned double patterning (SADP) process, a spacer-is-dielectric (SID) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented for forming fin 204. Further, in some alternate embodiments, the exposure process can implement maskless lithography, e-beam writing, and/or ion-beam writing for patterning.

Gate stacks, such as a gate stack 206A and a gate stack 206B, are formed over portions of fin 204. Gate stacks 206A, 206B extend lengthwise in a direction that is different than (e.g., orthogonal to) the lengthwise direction of fin 204. For example, gate stacks 206A, 206B extend substantially parallel to one another along the x-direction, having a length defined in the x-direction, a width defined in the y-direction, and a height defined in the z-direction. Gate stacks 206A, 206B are disposed between S/D regions of fin 204, where channel regions of fin 204 underlie gate stacks 206A, 206B. In the X-Z plane, gate stacks 206A, 206B wrap top surfaces and sidewall surfaces of fin 204. In the Y-Z plane, gate stacks 206A, 206B are disposed over top surfaces of respective channel regions of fin 204.

Gate stacks 206A, 206B are formed by deposition processes, lithography processes, etching processes, other suitable processes, or combinations thereof. For example, a deposition process is performed to form a gate electrode layer over fin 204 and a hard mask layer over the gate electrode layer. In some embodiments, before forming the gate electrode layer, a deposition process is performed to form a gate dielectric layer over fin 204. In such embodiments, the gate electrode layer is deposited over the gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), plasma enhanced ALD (PEALD), low-pressure CVD (LPCVD), atomic layer CVD (ALCVD), atmospheric pressure CVD (APCVD), other suitable methods, or combinations thereof. A gate patterning process (including, for example, various lithography processes, etching processes, and/or cleaning processes) is then performed to pattern the gate electrode layer and the hard mask layer (and, in some embodiments, the gate dielectric layer) to form gate stacks 206A, 206B.

Continuing with FIG. 2A, gate spacers 208 are formed along sidewalls of gate stacks 206A, 206B. Gate spacers 208 are formed having a thickness t1 along sidewalls of gate stacks 206A, 206B. In some embodiments, thickness t1 is at least 5 nm. For example, thickness t1 is about 5 nm to about 10 nm. As described further below, because the present disclosure replaces a portion of gate spacer 208 with a contact etch stop layer to lower capacitances and/or resistances associated with semiconductor device 200, and thereby improve performance of semiconductor device 200, thickness t1 is greater than a thickness of gate spacers fabricated by conventional methods. When thickness t1 is less than about 5 nm, a thickness of gate spacers 208 along sidewalls of gate stacks 206A, 206B may be insufficient for a subsequent gate spacer etch/trim, which is further described below, and may result in damage to gate stacks 206A, 206B during the gate spacer etch/trim. When thickness t1 is less than about 2 nm, further processing may be difficult due to a smaller marginal window in etch process variation. In some embodiments, when thickness t1 is less than about 5 nm, a thickness of a remainder of gate spacers 208 and subsequently formed contact etch stop layer may not provide sufficient insulation between gate stacks 206A, 206B and a subsequently formed source/drain contact, which can lead to undesirable resistance and/or capacitance. In some examples, thickness t1 is about 1 nm to about 5 nm greater than gate spacers fabricated by conventional methods, such as those that do not trim and/or replace a portion of the gate spacers.

Gate spacers 208 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In the depicted embodiment, gate spacers 208 include a dielectric material having a dielectric constant that is greater than or equal to about 7. For example, a dielectric layer including silicon and nitrogen, such as a silicon nitride layer, can be deposited over gate stacks 206A, 206B and subsequently etched (e.g., anisotropically etched) to form gate spacers 208. In some embodiments, gate spacers 208 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to gate stacks 206A, 206B. In such implementations, the various sets of spacers can include materials having different etch rates. For example, a first dielectric layer including silicon and oxygen (e.g., silicon oxide) can be deposited and etched to form a first spacer set adjacent to gate stacks 206A, 206B, and a second dielectric layer including silicon and nitrogen (e.g., silicon nitride) can be deposited and etched to form a second spacer set adjacent to the first spacer set. In some embodiments, gate spacers 208 include L-shaped liners and main spacers disposed over the L-shaped liner. In such embodiments, L-shaped liners are disposed between gate stacks 206A, 206B and the main spacers and are further disposed between fin 204 and the main spacers. In some embodiments, gate spacers 208 include main spacers and no L-shaped liners. In some embodiments, gate spacers 208 include main spacers with liners between gate stacks 206A, 206B and main spacers, but not between main spacers and fin 204. In some embodiments, gate spacers 208 may include a low-k dielectric material such as FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In some embodiments, etching gate spacers 208 may remove a portion of fin 204 in the S/D regions.

Figure 2B:
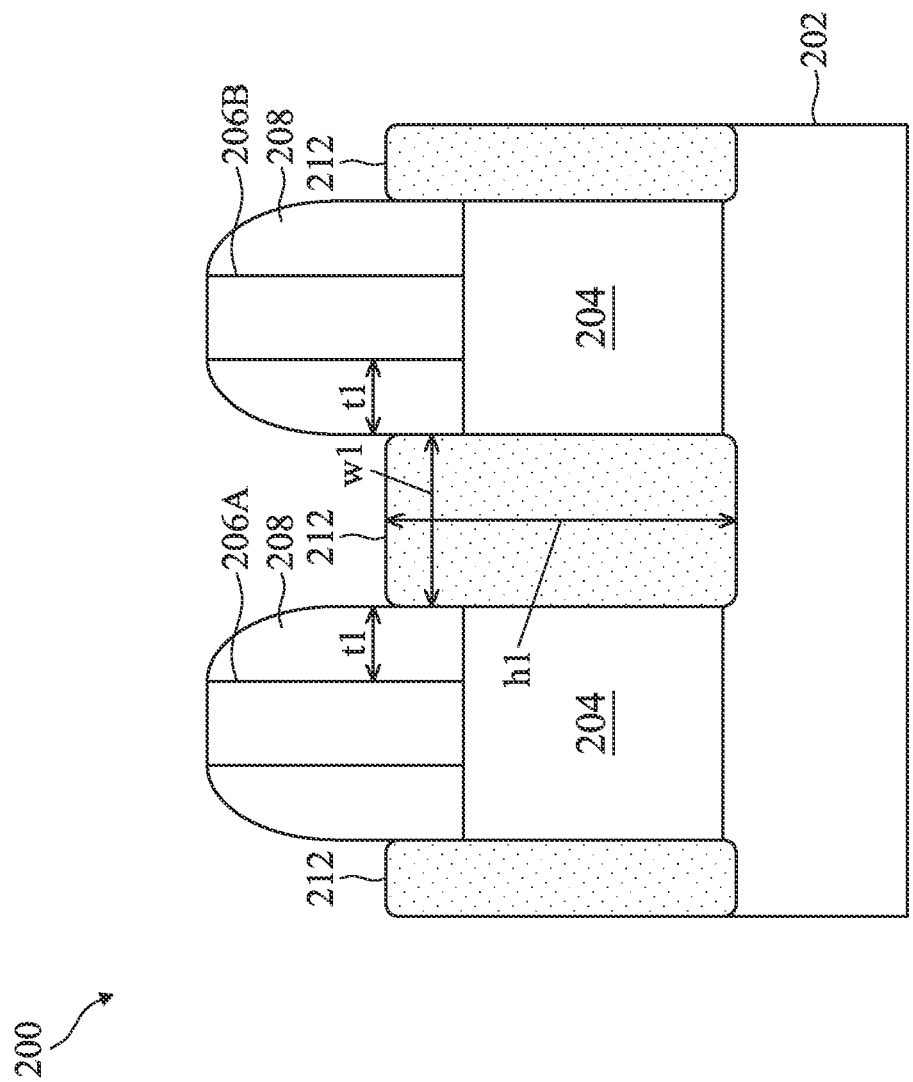

Processing then continues, as depicted in FIG. 2B, with performing an etch process to form a source/drain recesses in S/D regions of fin 204. Source/drain recesses may be formed by an etching process that completely removes a portion of fin 204 in S/D regions of semiconductor device 200 and partially removes a portion of substrate 202 in S/D regions of semiconductor device 200. In some embodiments, the etching process further removes some, but not all, of substrate 202, such that source/drain recesses extend below a topmost surface of substrate 202. The etching process can include a dry etching process, a wet etching process, other suitable etching process, or combinations thereof. In some embodiments, the etching process is a multi-step etch process. In some embodiments, the etching process may alternate etchants to separately and alternately remove semiconductor layers in a stack of semiconductor layers for a GAA device. In some embodiments, parameters of the etching process are configured to selectively etch fin 204 with minimal (to no) etching of gate stacks 206A, 206B and gate spacers 208. In some embodiments, a lithography process, such as those described herein, is performed to form a patterned mask layer that covers gate stacks 206A, 206B and gate spacers 208 and the etching process uses the patterned mask layer as an etch mask.

Epitaxial source/drain features 212 are formed in source/drain recesses. Epitaxial source/drain features 212 have a height h1. In some embodiments, h1 is about 50 nm to about 70 nm. Epitaxial source/drain features 212 have a width w1 between a first one of gate spacers 208 (along a sidewall of gate stack 206A) and a second one of gate spacers 208 (along a sidewall of gate stack 206B). In some embodiments, width w1 is about 25 nm to about 50 nm. The increased thickness of gate spacers 208 reduces the width w1, and volume, of epitaxial source/drain features 212. The decreased volume of epitaxial source/drain features 212 reduces the capacitance between a gate (e.g., gate stack 206A or gate stack 206B) and epitaxial source/drain features 212. A first gate structure (including gate stack 206A and gate spacers 208) interposes respective epitaxial source/drain features 212, such that a channel region of fin 204 is between the respective epitaxial source/drain features 212. A second gate structure (including gate stack 206B and gate spacers 208) interposes respective epitaxial source/drain features 212, such that a channel region of fin 204 is between the respective epitaxial source/drain features 212. In some embodiments, the first gate structure and its respective epitaxial source/drain features 212 form a portion of a first FinFET, and the second gate structure and its respective epitaxial source/drain features 212 form a portion of a second FinFET. In some embodiments, the first gate structure and its respective epitaxial source/drain features 212 form a portion of a first GAA device, and the second gate structure and its respective epitaxial source/drain features 212 form a portion of a second GAA device. In some embodiments, a deposition process is performed to fill source/drain recesses with epitaxial semiconductor material, thereby forming epitaxial source/drain features 212. For example, a semiconductor material is epitaxially grown from portions of fin 204 and/or substrate 202 forming source/drain recesses. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous (for example, Si-containing gases, such as $SiH_4$, and/or Ge-containing gases, such as $GeH_4$) and/or liquid precursors, which interact with the composition of fin 204 and/or substrate 202. Epitaxial source/drain features 212 are doped with n-type dopants and/or p-type dopants. In some embodiments, epitaxial source/drain features 212 are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 212 are epitaxial layers including silicon and germanium, where the silicon-and-germanium-comprising epitaxial layers are doped with boron, other p-type dopant, or combinations thereof. In some embodiments, epitaxial source/drain features 212 include materials and/or dopants that achieve desired tensile stress and/or compressive stress in the channel regions. In some embodiments, epitaxial source/drain features 212 are doped during deposition by adding impurities to a source material of the epitaxy process. In some embodiments, epitaxial source/drain features 212 are doped by an ion implantation process subsequent to a deposition process. In some embodiments, annealing processes are performed to activate dopants in epitaxial source/drain features 212 and/or other source/drain regions of semiconductor device 200 (for example, HDD regions and/or LDD regions).

Figure 2C:
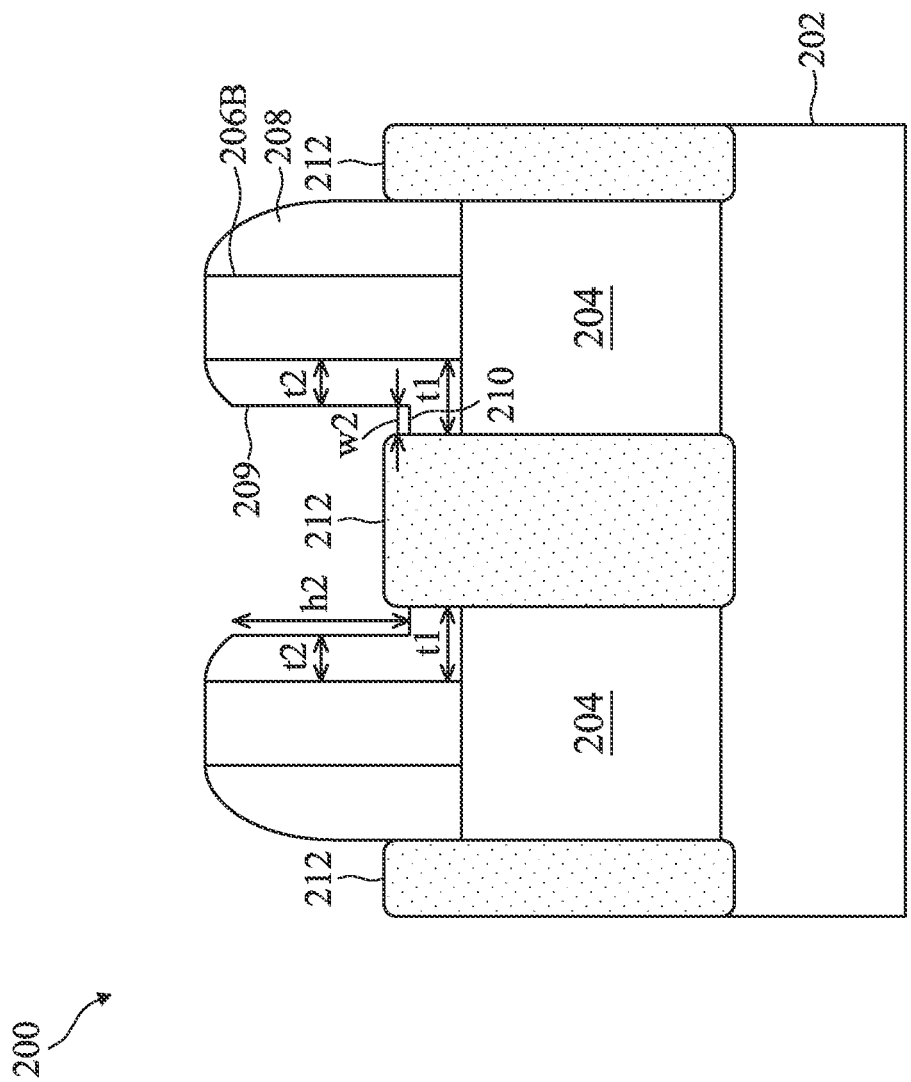

Turning to FIG. 2C, a trimming process is performed on gate spacers 208. For example, a spacer etch process is used on gate spacers 208 to reduce the thickness of a portion of gate spacers 208. In the depicted embodiment, the trimming process is performed on gate spacers 208 adjacent to subsequently formed source/drain contacts. It is understood that the trimming process described below may be performed on all depicted gate spacers or a subset of depicted gate spacers. For example, the depicted embodiment illustrates the performing the trimming process on a subset of gate spacers. The spacer etch process is an anisotropic etch process, which generally refers to an etch process having different etch rates in different directions, such that the etch process removes material in specific directions, such as substantially in one direction. The spacer etch removes a portion of gate spacers 208, thereby reducing a thickness of a portion of gate spacers 208 above epitaxial source/drain feature 212. For example, trimmed gate spacers 208 have a first portion having thickness t2 disposed over a second portion having thickness t1, where the second portion is disposed between a respective one of gate stacks 206A, 206B and a respective one of epitaxial source/drain features 212. Reducing thickness t2 reduces the capacitance of semiconductor device 200. In some embodiments, thickness t2 is about 2 nm to about 4 nm. When thickness t1 is greater than about 10 nm, a contact open (e.g., a void formed in a source/drain contact) may be induced due to the contact opening being too small. Accordingly, thickness t1 may be about 2.5 times to about 5 times larger than thickness t2. If thickness t1 is less than about 2 times thicker than thickness t2, semiconductor device 200 may have reliability issues. For example, the subsequently formed source/drain may contact gate stack 206A and/or gate stack 206B, causing an electrical short, if thickness t1 is less than twice as thick as thickness t2. If thickness t1 is more than 5 times thickness t2, then there may contact opening etch problems. Therefore, thickness t2 should be as thin as possible without causing reliability issues in order to decrease capacitance of semiconductor device 200.

The spacer etch forms a recess in each gate spacer 208 that is formed by a sidewall 209 of the first portion of the gate spacer 208 and a top surface 210 of the second portion of the gate spacer 208. The second portion of the gate spacer 208 has a height h2, and top surface 210 has a width w2. In some embodiments, height h2 is about 5 nm to about 12 nm. In some embodiments, width w2 is about 2 nm to about 8 nm. In the depicted embodiment, trimmed gate spacers 208 are slightly vertically etched, such that top surface 210 is below top surface of epitaxial source/drain feature 212. Top surface 210 may be above the top surface of epitaxial source/drain feature 212. In some embodiments, top surface 210 may be substantially planar with the top surface of epitaxial source/drain feature 212. In some embodiments, a patterning layer, such as a hard mask, is formed over semiconductor device 200 to protect some of gate spacers 208 from the spacer etch. In some embodiments, the spacer etch is performed on both gate spacers 208 along sidewalls of gate stack 206A. In some embodiments, the spacer etch is performed on both gate spacers 208 along sidewalls of gate stack 206B.

In some embodiments, spacer etch has a horizontal etch rate that is greater than a vertical etch rate (in some embodiments, the vertical etch rate equals zero). The spacer etch thus removes material in substantially the horizontal direction with minimal, to no, material removal in the vertical direction. Spacer etch is tuned to be selective between the material of gate spacers 208 and the material of epitaxial source/drain features 212 and gate stacks 206A, 206B. Spacer etch may etch gate spacers 208 with minimal, to no, etching of epitaxial source/drain features 212 and gate stacks 206A, 206B. Excessive etching of gate spacers 208 and/or gate stacks 206A, 206B may damage gate stacks 206A, 206B and negatively impact the capacitance and/or resistance of semiconductor device 200. Similarly, excessive etching of epitaxial source/drain features 212 may negatively affect the resistance of S/D regions due to the decreased volume of the epitaxial source/drain features 212.

In some embodiments, the spacer etch is a dry etch process, such as an RIE process, that uses a fluorine-containing etch gas to remove the material of the spacer layer (e.g., silicon nitride) at a higher rate than the materials of gate stacks 206A, 206B (e.g., oxide hard mask or polysilicon) and/or fin 204 (e.g., silicon) (i.e., the etchant has a high etch selectivity with respect to silicon nitride) and/or epitaxial source/drain feature 212 (e.g., silicon, germanium, silicon-germanium). In some embodiments, spacer etch is configured to generate a fluorine-containing plasma from the fluorine-containing gas, such that spacer etch removes portions of the spacer layer using plasma-excited fluorine-containing species. The fluorine-containing etch gas includes fluorine ($F_2$), fluoromethane (e.g., $CH_3F$), difluoromethane (e.g., $CH_2F_2$), trifluoromethane (e.g., $CHF_3$), tetrafluoromethane (e.g., $CF_4$), hexafluoroethane (e.g., $C_2F_6$), sulfur hexafluoride (e.g., $SF_6$), nitrogen trifluoride (e.g., $NF_3$), other fluorine-containing etchant, or combinations thereof. Spacer etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, $O_2$), a bromine-containing etch gas (for example, HBr and/or $CHBr_3$), an iodine-containing etch gas, other suitable etch gas, or combinations thereof. Spacer etch may be configured to generate a plasma from any of the etch gases disclosed herein, such that spacer etch uses plasma-excited species for etching. In some embodiments, a carrier gas is used to deliver the fluorine-containing etch gas and/or other etch gas. The carrier gas may be an inert gas, such as an argon-containing gas, a helium-containing gas, a xenon-containing gas, other suitable inert gas, or combinations thereof. In some embodiments, spacer etch is a wet, anisotropic etch process.

Various etch parameters of spacer etch can be tuned to achieve selective and anisotropic etching of the spacer layer, such as etch gas composition, carrier gas composition, etch gas flow rate, carrier gas flow rate, etch time, etch pressure, etch temperature, source power, radio frequency (RF) and/or direct current (DC) bias voltage, RF and/or DC bias power, other suitable etch parameters, or combinations thereof.

Figure 2D:
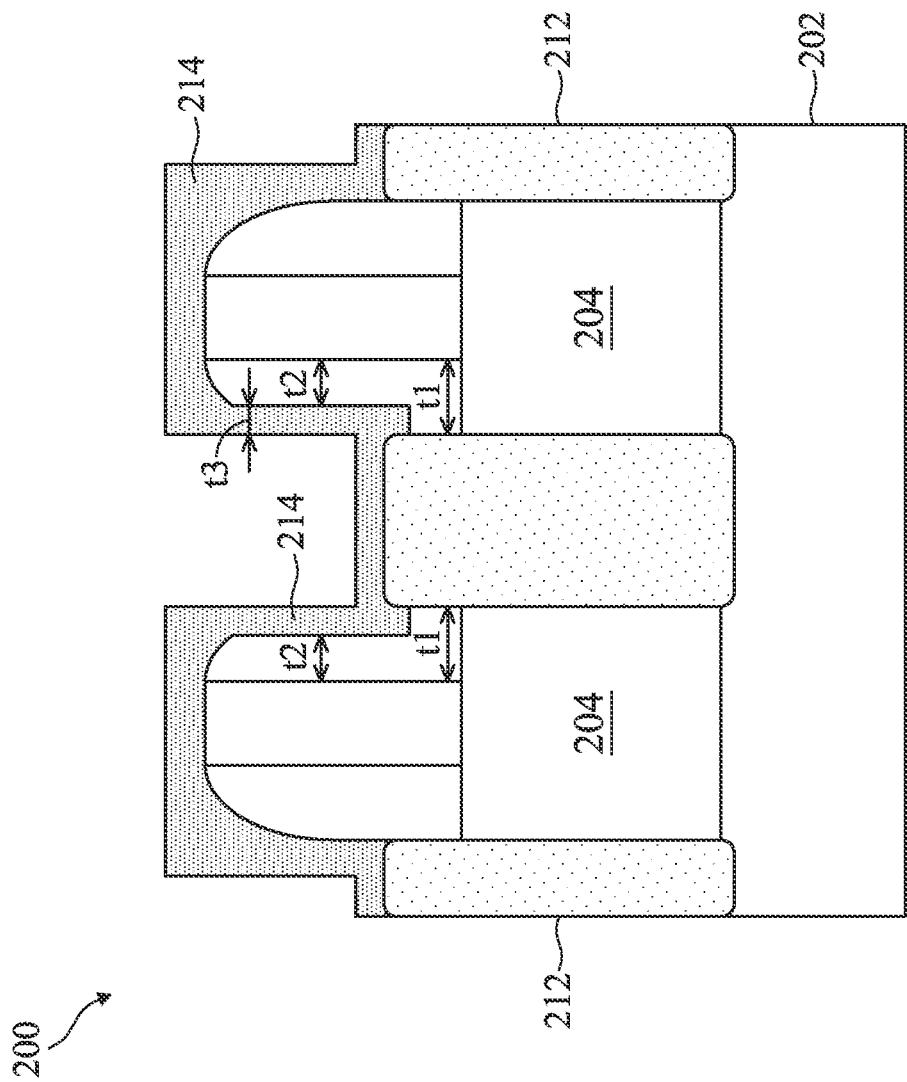

Turning to FIG. 2D, a contact etch stop layer (CESL) 214 is formed over gate spacers 208. CESL 214 includes a dielectric material having a dielectric constant less than a dielectric material of gate spacers 208, such as a dielectric constant that is less than 6. In some embodiments, the dielectric material of CESL 214 has a dielectric constant of about 2 to about 6. In some embodiments, the dielectric material has a dielectric constant less than about 2.5, which can be referred to as an extreme low-k (ELK) dielectric material. In some embodiments, a dielectric material of CESL 214 is different than the dielectric material of gate spacers 208. In some embodiments, CESL 214 and gate spacers 208 include different low-k materials. In some embodiments, CESL 214 may include silicon and oxygen (for example, SiCOH, SiOx, or other silicon-and-oxygen comprising material). In the depicted embodiments, CESL 214 includes silicon and nitrogen and/or carbon (for example, SiN, SiCN, SiCON, SiON, SiC, SiCO, metal nitride, and/or metal carbonitride). For example, CESL 214 is a silicon nitride layer (e.g., SiN layer or SiCN layer) having a dielectric constant that is about 2 to about 6. Generally, silicon nitride CESL materials have a k value of about 6 to about 7. However, the present disclosure proposes tuning a deposition process to deposit a silicon nitride material over gate spacers 208 having a dielectric constant that is about 2 to about 6, thereby providing a "low-k" silicon nitride CESL. For example, the k value may be lowered to below 6 by increasing the use of a precursor, such as $CH_3$, during the deposition process, and/or by adding oxygen to the silicon nitride material during the deposition process. In some embodiments, the k value of the silicon nitride material may be lowered to about 3 to about 4.5 by tuning the deposition process, such as an amount of precursor and/or an amount of oxygen. CESL 214 is formed by a deposition process, such as CVD, PVD, ALD, HDPCVD, MOCVD, RPCVD, PECVD, LPCVD, ALCVD, APCVD, PEALD, other suitable methods, or combinations thereof.

CESL 214 may reduce gate contact leakage by reducing conduction between gate stacks 206A, 206B and a subsequently formed source/drain contact and/or conduction between gate stacks 206A, 206B and epitaxial source/drain features 212. CESL 214 has a thickness t3. In some embodiments, thickness t3 is about 3 nm to about 8 nm. Replacing a portion of the gate spacers 208 with CESL 214 as herein described reduces the capacitance between a gate contact and a source/drain contact and/or between the gate contact and epitaxial source/drain feature 212 without leakage between the gate contact and the source/drain contact. For example, because CESL 214 has a dielectric constant that is less than gate spacers 208, CESL 214 further reduces a capacitance between gate stacks 206A, 206B and subsequently formed source/drain contacts, thereby greatly reducing parasitic capacitance and associated RC delay of semiconductor device 200.

Figure 2E:
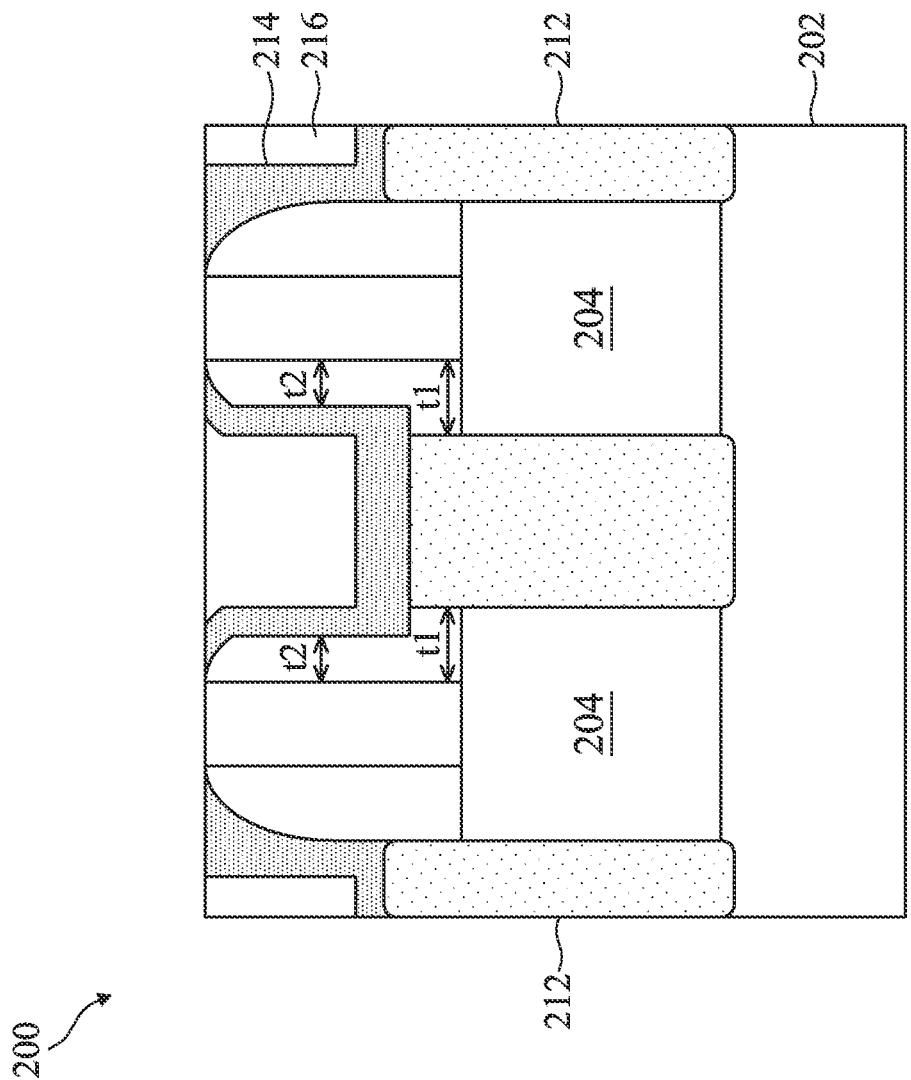

Turning to FIG. 2E, an inter-level dielectric (ILD) layer 216 is formed over epitaxial source/drain features 212, gate stacks 206A, 206B, gate spacers 208, and CESL 214, for example, by a deposition process (such as CVD, PVD, ALD, HDPCVD, MOCVD, RPCVD, PECVD, LPCVD, ALCVD, APCVD, plating, other suitable methods, or combinations thereof). In some embodiments, ILD layer 216 is formed by a flowable CVD (FCVD) process that includes, for example, depositing a flowable material (such as a liquid compound) over semiconductor device 200 and converting the flowable material to a solid material by a suitable technique, such as thermal annealing and/or ultraviolet radiation treating. ILD layer 216 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In the depicted embodiment, ILD layer 216 is a dielectric layer that includes a low-k dielectric material (generally referred to as a low-k dielectric layer). ILD layer 216 can include a multilayer structure having multiple dielectric materials. Subsequent to the deposition of ILD layer 216, a CMP process and/or other planarization process can be performed until reaching (exposing) a top portion (or top surface) of gate stacks 206A, 206B. The planarization process removes portions of ILD layer 216 and/or CESL 214 from top surfaces of gate stacks 206A, 206B. In some embodiments, the planarization process removes hard mask layers to expose underlying gate electrodes of gate stacks 206A, 206B. In such embodiments, the planarization process may reduce heights of gate spacers 208.

ILD layer 216 may be a portion of a multilayer interconnect (MLI) feature disposed over substrate 202. The MLI feature electrically couples various devices (for example, FinFETs of semiconductor device 200, transistors, resistors, capacitors, and/or inductors) and/or components (for example, gate structures and/or epitaxial source/drain features of semiconductor device 200), such that the various devices and/or components can operate as specified by design requirements of semiconductor device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of semiconductor device 200 and/or distribute signals (for example, clock signals, voltage signals, and/or ground signals) to the devices and/or the components of semiconductor device 200.

In some embodiments, semiconductor device 200 may be formed using a gate last process where gate stacks 206A, 206B are dummy gate stacks. Dummy gate stacks (e.g., polysilicon gates) may be replaced with metal gate stacks (e.g., gate dielectric and gate electrode, such as a high-k/metal gate stack) using a gate last process after depositing ILD layer 216. In some embodiments, semiconductor device 200 may be formed using a gate first process where gate stacks 206A, 206B are not replaced after depositing ILD layer 216. In some embodiments, semiconductor device 200 may be formed using a combination of gate first processing and gate last processing where gate stacks 206A, 206B, or a portion thereof, are replaced at a step prior to forming ILD layer 216.

Figure 2F:
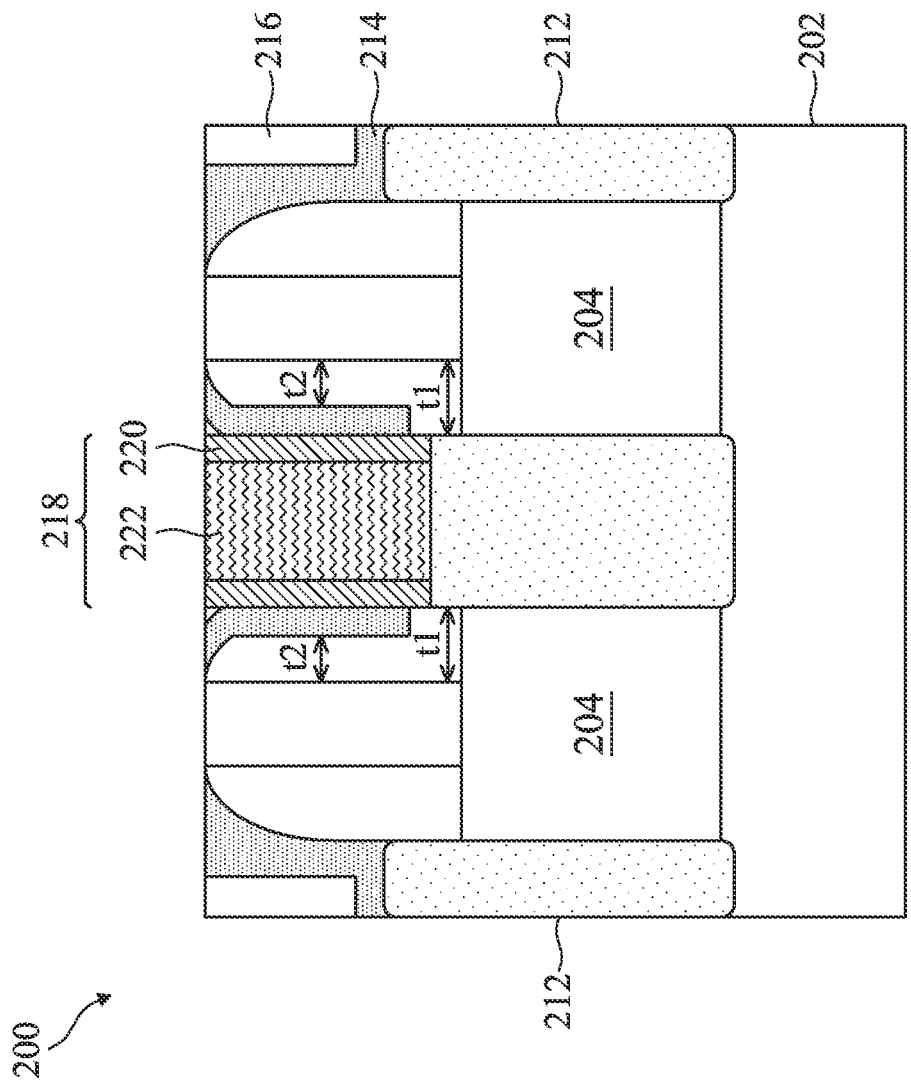

Turing to FIG. 2F, a source/drain contact 218 is then formed to at least one of epitaxial source/drain features 212, where source/drain contact 218 is formed along sidewalls of CESL 214. A contact opening is formed in ILD layer 216. Source/drain contact 218 is then formed in the contact opening. Source/drain contact 218 includes a contact barrier layer 220 and a contact bulk layer 222. In some embodiments, the contact opening exposes CESL 214 and source/drain contact 218 is disposed on sidewalls of CESL 214, specifically contact barrier layer 220. In some embodiments, the contact opening does not expose CESL 214 and ILD layer 216 is disposed between source/drain contact 218 and CESL 214. In the depicted embodiment, contact barrier layer 220 is formed on sidewalls of CESL 214 and on a top surface of epitaxial source/drain feature 212. In some embodiments, a silicide layer is disposed between source/drain contact 218 and epitaxial source/drain feature 212.

In some embodiments, source/drain contact 218 is formed by performing a first deposition process to form a contact barrier material in the contact opening over CESL 214 and epitaxial source/drain feature 212, where the contact barrier material partially fills the source/drain contact opening and performing a second deposition process to form a contact bulk material over the contact barrier material, where the contact bulk material fills a remainder of the source/drain contact opening. In such embodiments, contact barrier material and contact bulk material are disposed in the source/drain contact opening and over the top surface epitaxial source/drain feature 212. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 220 has a substantially uniform thickness along sidewalls of CESL 214 and along the top of epitaxial source/drain feature 212. Contact barrier layer 220 may thus be formed by a conformal deposition process. A CMP process and/or other planarization process is performed to remove excess contact bulk material and/or contact barrier material, for example, from over the top surface of ILD layer 216 and gate stacks 206A, 206B, resulting in source/drain contact 218 (in other words, contact barrier layer 220 and contact bulk layer 222 filling the source/drain contact opening).

Contact barrier layer 220 includes a material that promotes adhesion between a surrounding dielectric material (here, CESL 214) and contact bulk layer 222. The material of contact barrier layer 220 may further prevent diffusion of metal constituents from source/drain contact 218 into the surrounding dielectric material. In some embodiments, contact barrier layer 220 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 220 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 220 includes multiple layers. For example, contact barrier layer 220 may include a first sub-layer that includes titanium and a second sub-layer that includes titanium nitride. In another example, contact barrier layer 220 may include a first sub-layer that includes tantalum and a second sub-layer that includes tantalum nitride. Contact bulk layer 222 includes tungsten, ruthenium, cobalt, copper, aluminum, iridium, palladium, platinum, nickel, low resistivity metal constituent, alloys thereof, or combinations thereof. In the depicted embodiment, contact bulk layer 222 includes tungsten, ruthenium, and/or cobalt. In some embodiments, source/drain contact 218 does not include contact barrier layer 220 (i.e., source/drain contact 218 is a barrier-free contact), such that contact bulk layer 222 physically contacts CESL 214. In some embodiments, source/drain contact 218 is partially barrier-free, where contact barrier layer 220 is disposed between CESL 214 and a portion of contact bulk layer 222. In some embodiments, contact bulk layer 222 includes multiple layers.

Figure 3:
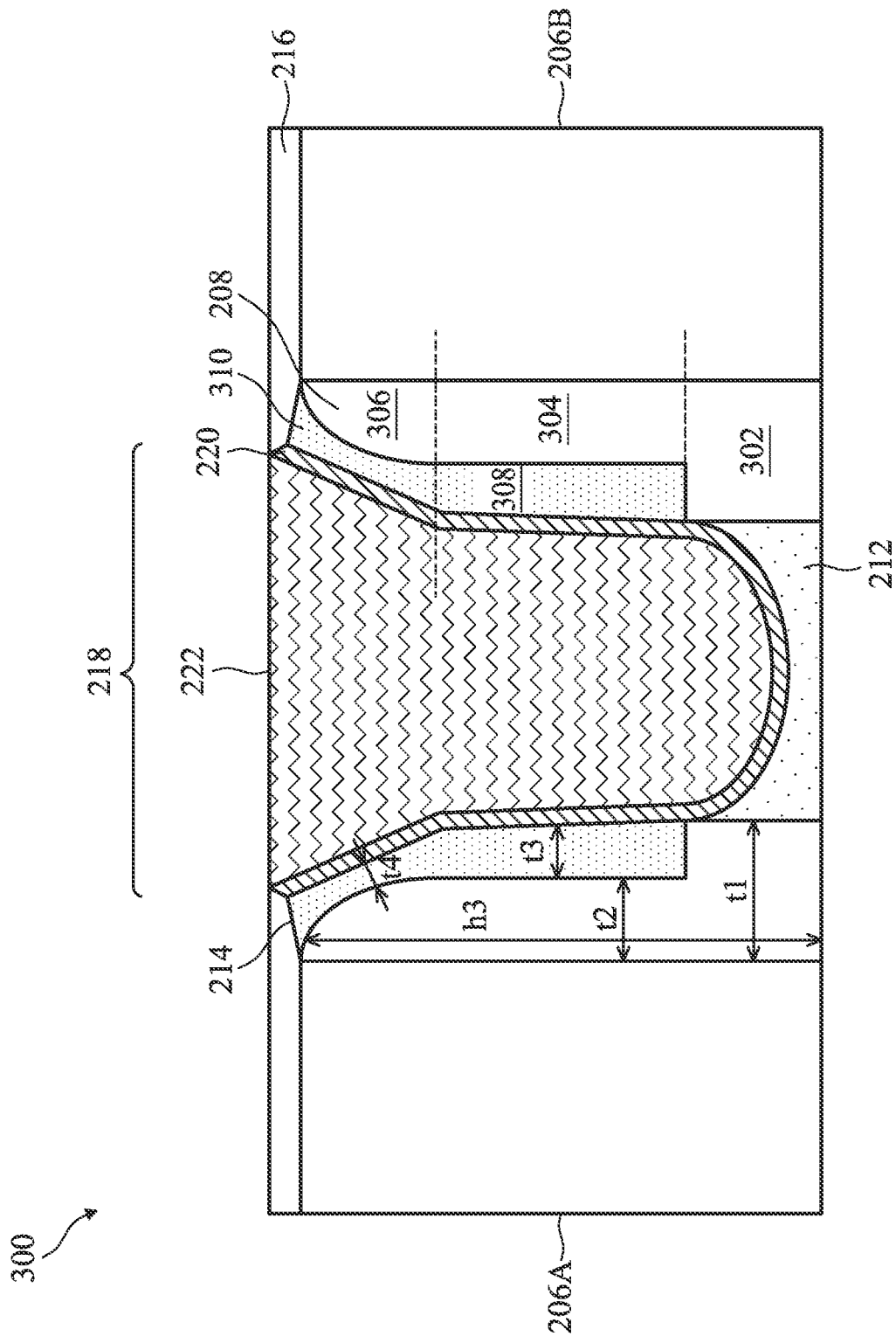
FIG. 3 is a diagrammatic cross-sectional view of a semiconductor device fabricated (such as with the method of FIG. 1) according to various aspects of the present disclosure.

Turning to FIG. 3, depicted is a diagrammatic cross-sectional view of a semiconductor device 300 according to various aspects of the present disclosure. Semiconductor device 300 may be an example of a structure that can arise following the steps of method 100 and described above with respect to FIGS. 2A-2F. Semiconductor device 300 includes gate stack 206A and gate stack 206B, as described above. In some embodiments, gate stacks 206A, 206B may be disposed over a channel region of a fin of a FinFET. In some embodiments, gate stacks 206A, 206B may be disposed over a channel layer (e.g., nanowires, nanosheets, nanobars, nanostructure, and/or other channel suspended over a substrate) of a gate all around (GAA) device. Gate spacers 208 are disposed along sidewalls of gate stacks 206A, 206B. CESL 214 is formed over gate spacers 208. Source/drain feature 212 is disposed between gate stacks 206A and 206B and extends from one gate spacer 208 disposed on a sidewall of gate stack 206A to another gate spacer 208 disposed on a sidewall of gate stack 206B. Source/drain contact 218 is disposed over source/drain feature 212 and between gate stacks 206A and 206B.

Gate spacers 208 are patterned as described above with respect to method 100 and FIGS. 2A-2F, such that gate spacers 208 are L-shaped and have a bottom portion 302, a middle portion 304, and a top portion 306. The bottom portions 302 of gate spacers 208 extend from a sidewall of a gate stack (e.g., gate stack 206A) to a sidewall of source/drain feature 212. The bottom portions 302 of gate spacers 208 have a thickness t1 that may be about 5 nm to about 10 nm. The bottom portions 302 of gate spacers 208 have substantially straight, parallel sidewalls, such that the bottom portions 302 of gate spacers 208 have substantially the same thickness (i.e., thickness t1) along a height h3 of gate spacers 208. Height h3 may be about 100 nm to about 200 nm. The middle portions 304 of gate spacers 208 extend from the sidewall of a gate stack (e.g., gate stack 206A) to a sidewall of CESL 214. The middle portions 304 of gate spacers 208 have a thickness t2 that may be about 2 nm to about 4 nm. The middle portions 304 of gate spacers 208 have substantially straight, parallel sidewalls, such that the middle portions 304 of gate spacers 208 have substantially the same thickness (i.e., thickness t2) along the height h3 of gate spacers 208. The top portions 306 of gate spacers 208 have a tapered thickness, as illustrated, where the thickness of the top portions decreases along the height h3 of gate spacers 208 from thickness t2 to a thickness that is less than thickness t2 proximate a top surface of the gate stack (e.g., gate stack 206A). The top portions 306 of gate spacers 208 have a substantially straight sidewall and a curved sidewall. Thickness t1 may be about 2.5 times to about 5 times larger than thickness t2. If thickness t1 is less than 2 times larger than thickness t2, then a source/drain-gate short may cause reliability issues with semiconductor device 300. If thickness t1 is greater than 5 times thickness t2, then capacitance of semiconductor device 300 increases. Specifically, capacitance between the gate 206A and source/drain contact 218 may increase.

In some embodiments, gate spacer 208 may be formed of a single layer of dielectric material. In some other embodiments, gate spacer 208 may be formed of multiple layers of dielectric material. Each layer of dielectric material may have a different dielectric constant than the other layers. Therefore, gate spacer 208 may have an overall dielectric constant that is different than any single layer of dielectric material.

CESL 214 is disposed on sidewalls of gate spacers 208 extending from a top surface of the bottom portion 302 of gate spacers 208 to the top surface of the gate stack (e.g., gate stack 206A). CESL 214 has bottom portions 308 that extend from sidewalls of the middle portions 304 of gate spacers 208 to sidewalls of source/drain contact 218. The bottom portions 308 of CESL 214 have a thickness t3 that may be about 3 nm to about 8 nm. The bottom portions 308 of CESL 214 have substantially straight, parallel sidewalls, such that the bottom portions 308 of CESL 214 have substantially the same thickness (i.e., thickness t3) along a height h3 of gate spacers 208. CESL 214 has top portions 310 that are disposed on the curved sidewalls of the top portions 306 of gate spacer 208. The top portions 310 of CESL 214 have a thickness t4 that may be smaller than thickness t3. Thickness t4 may be about 2 nm to about 6 nm. The thickness of CESL 214 may vary through the top portions 310 of CESL 214 with the narrowest thickness between the bottom portions 308 of CESL 214 and the top surface of the gate stacks. In some embodiments, the top portions 310 of CESL 214 have a middle portion disposed between end portions, where a thickness of the middle portion is less than thicknesses of the end portions. In some embodiments, thickness t4 is between curved sidewall surfaces of gate spacers 208 and source/drain contact 218.

CESL 214 may have a dielectric constant of about 2 to about 6. In some embodiments, CESL 214 may have a dielectric constant of about 3 to about 4.5. The value of the dielectric constant of CESL 214 may be lower than the dielectric constant of gate spacer 208. In some embodiments, gate spacers 208 include a single silicon nitride layer, and CESL 214 includes a single silicon nitride layer, but a dielectric constant of the silicon nitride layer of CESL 214 (e.g., about 2 to about 6) is less than a dielectric constant of the silicon nitride layer of gate spacers 208 (e.g., about 7). In some embodiments, where gate spacer 208 includes multiple layers, the dielectric constant of CESL 214 may be lower than the dielectric layer of gate spacer 208 that is directly contacting CESL 214.

A source/drain contact 218, including contact barrier layer 220 and contact bulk layer 222 is formed over CESL 214 and source/drain feature 212. In some embodiments, a portion of source/drain contact 218 may be disposed along a sidewall of the bottom portions of gate spacers 208. Source/drain contact 218 has a top portion extending between the top portions of CESL 214 and a bottom portion extending between the bottom portions of CESL 214. The top portion of source/drain contact 218 may be wider than the bottom portion as CESL 214. The top portion of source/drain contact 218 may curve along a sidewall of the top portion of CESL 214. In some embodiments, the top portion of source/drain contact 218 has a tapered thickness, and the bottom portion of source/drain contact 218 has a substantially uniform thickness. An inter-level dielectric (ILD) layer 216 is disposed over semiconductor device 300, including over gate stacks 206A, 206B, CESL 214, and source/drain contact 218. In some embodiments, the ILD layer is disposed between CESL 214 and source/drain contact 218.

Figure 4:
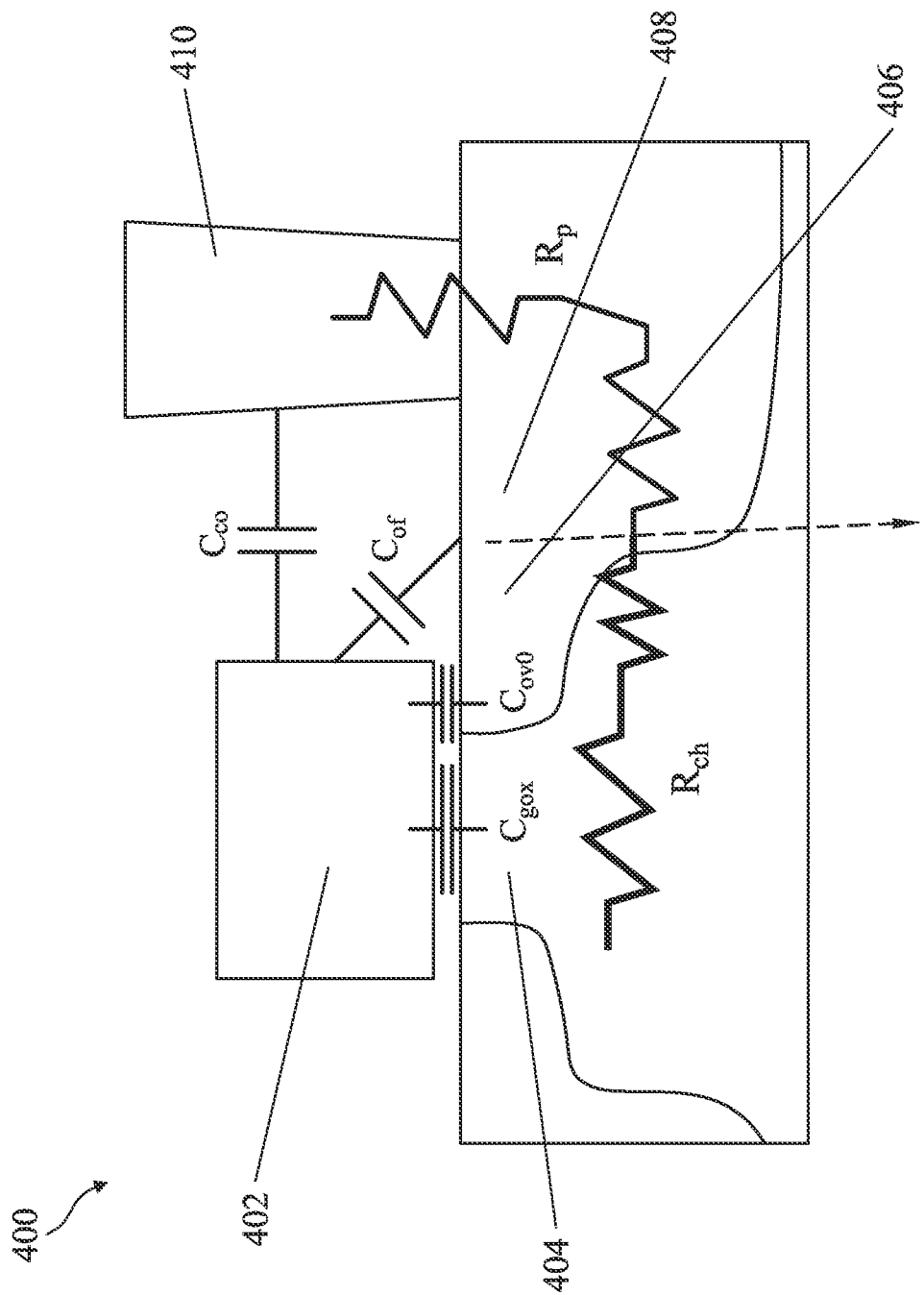
FIG. 4 is an illustration of the various resistances and capacitances associated with a semiconductor device (such as one associated with the semiconductor device of FIGS. 2A-2F) according to various aspects of the present disclosure.

Turning to FIG. 4, depicted is a semiconductor device 400 cross section that illustrates various capacitances and resistances that may exist within semiconductor device 400. Semiconductor device 400 includes a gate structure 402, a channel region 404, a source/drain region including a first portion 406 and a second portion 408, and a source/drain contact 410. A capacitance Cgox is illustrated between gate structure 402 and channel region 404. A capacitance Cov0 (often referred to as a gate-source/drain overlap capacitance) is illustrated between gate structure 402 and first portion 406 of the source/drain region. A capacitance Cof is illustrated between gate structure 402 and second portion 408 of the source/drain region. A capacitance Cco is illustrated between gate structure 402 and source/drain contact 410. Some embodiments of the present disclosure may decrease the capacitances Cof and Cco, thereby reducing overall gate-to-source/drain capacitance (Cgd). A resistance Rp is illustrated between source/drain contact 410 and channel region 404. A resistance Rch is depicted within channel region 404. Some embodiments of the present disclosure may reduce RC delay in the semiconductor device with little, to no, current leakage along the path Rp.

Gate structure 402 includes a gate spacer which may be thicker than a typical gate spacer thickness. Using the spacer trim last process discussed above, a portion of the gate spacer is replaced with a low-k contact etch stop layer (CESL), which reduces the capacitances Cof and Cco, for example, by lowering a dielectric constant of insulating materials between gate structure 402 and source/drain contact 410. The thicker gate spacer further reduces a volume of the epitaxial source/drain feature, such as in the second portion 408 of the source/drain region. Reducing the volume of the second portion 408 of the source/drain region reduces the resistance Rp through the second portion 408 of the source/drain region. The reduced volume of the second portion 408 of source/drain region may further reduce the capacitance Cof between the source/drain region and the gate structure 402. These reductions in capacitances and the resistance may be achieved without leakage between gate structure 402 and source/drain contact 410 through Rp in part due to the low-k CESL that replaces the portion of the gate spacer. In some embodiments, an even lower capacitance may be achieved using a combination of a low-k gate spacer and a low-k CESL.

Reducing the capacitance (e.g., Cco and Cof) and resistance (e.g., Rp) reduces the resistive-capacitive (RC) delay of the semiconductor device. A lower RC delay improves the speed at which the semiconductor device may operate by increasing the signal speed of the semiconductor device. Lowering the RC delay without creating leakage between the gate structure and the source/drain contact further improves the performance of the semiconductor device.

The present disclosure provides for many different embodiments. An exemplary method forming a gate spacer adjacent a gate stack including receiving a semiconductor device having a gate stack disposed over a channel region of the semiconductor device. Forming a gate spacer on a sidewall of the gate stack. Forming a source/drain feature in a source/drain region of the semiconductor device, wherein the source/drain feature is adjacent the gate spacer. After forming the source/drain feature, performing an etch process to remove a first portion of the gate spacer so that a second portion of the gate spacer remains between the sidewall of the gate stack and the source/drain feature. Forming a contact etch stop layer on the gate spacer so that the contact etch stop layer is disposed on a top surface of the second portion of the gate spacer. The method further includes, forming a source/drain contact on the source/drain feature and adjacent the contact etch stop layer.

An exemplary device includes a gate stack disposed over a semiconductor layer and a gate spacer disposed on a sidewall of the gate stack. The device further includes a source/drain feature disposed in the semiconductor layer and adjacent the gate spacer. A low-k contact etch stop layer is disposed on a top surface and a sidewall of the gate spacer so that a portion of the gate spacer is disposed between the low-k contact etch stop layer and the semiconductor layer. The device further includes a source/drain contact disposed on the source/drain feature and adjacent the low-k contact etch stop layer.

Another exemplary deice includes a fin disposed over a substrate such that the fin extends along a first direction. A gate stack is disposed over a channel region of the fin so that the gate stack extends along a second direction that is different than the first direction. A gate spacer is disposed along a sidewall of the gate stack. The gate spacer has a first thickness along the first direction from a first sidewall of the gate spacer that is adjacent the gate stack to an opposing second sidewall of the gate spacer. The gate spacer has a second thickness along the first direction from the first sidewall of the gate spacer to an opposing third sidewall of the gate spacer. The second thickness is greater than the first thickness. The gate spacer has a top surface extending from the second sidewall of the gate spacer to the third sidewall of the gate spacer. The device further includes a contact etch stop layer that covers the top surface of the gate spacer. The contact etch stop layer extends from the second sidewall of the gate spacer to the third sidewall of the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a semiconductor device including a gate stack disposed over a channel region of the semiconductor device;
forming a gate spacer on a sidewall of the gate stack;
forming a source/drain feature in a source/drain region of the semiconductor device, wherein the source/drain feature is adjacent the gate spacer;
after forming the source/drain feature, performing an etch process to remove a first portion of the gate spacer, wherein a second portion of the gate spacer remains between the sidewall of the gate stack and the source/drain feature;
forming a contact etch stop layer on the gate spacer, wherein the contact etch stop layer is disposed on a top surface of the second portion of the gate spacer; and
forming a source/drain contact on the source/drain feature and adjacent the contact etch stop layer.

2. The method of claim 1, wherein the performing the etch process to remove the first portion of the gate spacer includes reducing a width of the gate spacer from a first width to a second width, thereby providing a third portion of the gate spacer having the second width, wherein the second portion of the gate spacer has the first width and the third portion of the gate spacer is disposed over the second portion of the gate spacer.

3. The method of claim 2, wherein the forming the contact etch stop layer includes depositing a dielectric material having a dielectric constant that is less than a dielectric constant of the gate spacer.

4. The method of claim 2,
wherein the forming the contact etch stop layer includes forming the contact etch stop layer on a sidewall of the third portion of the gate spacer, and
wherein the third portion of the gate spacer is between the sidewall of the gate stack and a sidewall of the contact etch stop layer.

5. The method of claim 1, wherein the gate spacer is formed having a thickness that is about 5 nm to about 10 nm.

6. The method of claim 1, further comprising:
forming an interlayer dielectric layer over the gate stack, the contact etch stop layer, and the source/drain feature before forming the source/drain contact; and
forming a contact opening, wherein the contact opening exposes a sidewall of the contact etch stop layer.

7. The method of claim 6, wherein the forming the contact opening includes:
removing a portion of the contact etch stop layer from over a top surface of the source/drain feature, wherein a portion of the sidewall of the contact etch stop layer is removed.

8. A semiconductor device, comprising:
a first gate stack and a second gate stack disposed over a semiconductor layer;
first L-shaped gate spacers disposed along first sidewalls of the first gate stack and second L-shaped gate spacers disposed along second sidewalls of the second gate stack;
a source/drain feature disposed in the semiconductor layer between the first gate stack and the second gate stack, wherein the source/drain feature is disposed between and physically contacts one of the first L-shaped gate spacers and one of the second L-shaped gate spacers;
a source/drain contact disposed on the source/drain feature, wherein the source/drain contact is disposed between and physically contacts the one of the first L-shaped gate spacers and the one of the second L-shaped gate spacers;
a first contact etch stop layer and a second contact etch stop layer, wherein the first contact etch stop layer is disposed between the source/drain contact and the one of the first L-shaped gate spacers and the second contact etch stop layer is disposed between the source/drain contact and the one of the second L-shaped gate spacers; and
wherein the first contact etch stop layer and the second contact etch stop layer have a first dielectric constant, the first L-shaped gate spacers and the second L-shaped gate spacers have a second dielectric constant, and the first dielectric constant is less than the second dielectric constant.

9. The semiconductor device of claim 8, wherein a first thickness of the first contact etch stop layer varies between the source/drain contact and the one of the first L-shaped gate spacers and a second thickness of the second contact etch stop layer varies between the source/drain contact and the one of the second L-shaped gate spacers.

10. The semiconductor device of claim 8, wherein:
the one of the first L-shaped gate spacers has a first portion between the first gate stack and the first contact etch stop layer and a second portion between the first gate stack and the source/drain feature, wherein the first portion has a first thickness, the second portion has a second thickness, and the second thickness is greater than the first thickness; and
the one of the second L-shaped gate spacers has a third portion between the second gate stack and the second contact etch stop layer and a fourth portion between the second gate stack and the source/drain feature, wherein the third portion has a third thickness, the fourth portion has a fourth thickness, and the fourth thickness is greater than the third thickness.

11. The semiconductor device of claim 10, wherein each of the second thickness and the fourth thickness is about 5 nm to about 10 nm and each of the first thickness and the third thickness is about 2 nm to about 8 nm.

12. The semiconductor device of claim 10, wherein the first contact etch stop layer and the second contact etch stop layer do not physically contact the source/drain feature.

13. The semiconductor device of claim 8, wherein the first L-shaped gate spacers, the second L-shaped gate spacers, the first contact etch stop layer, and the second contact etch stop layer each include silicon and nitrogen.

14. The semiconductor device of claim 8, wherein the first dielectric constant is 2 to 6 and the second dielectric constant is greater than or equal to 7.

15. A semiconductor device, comprising:
a fin disposed over a substrate, wherein the fin extends along a first direction;
a gate stack disposed over a channel region of the fin, wherein the gate stack extends along a second direction that is different than the first direction;
a gate spacer disposed along a sidewall of the gate stack, wherein a first portion of the gate spacer has a first thickness along the first direction that varies along a height of the gate spacer and a second portion of the gate spacer has a second thickness along the first direction that does not vary along the height of the gate spacer, wherein the second thickness is greater than the first thickness; and
a contact etch stop layer disposed on the first portion and the second portion of the gate spacer, wherein a first dielectric constant of the contact etch stop layer is less than a second dielectric constant of the gate spacer.

16. The semiconductor device of claim 15, further comprising:
a source/drain feature disposed in the fin, wherein the source/drain feature physically contacts the second portion of the gate spacer; and
a source/drain contact disposed over the source/drain feature, wherein the source/drain contact physically contacts the second portion of the gate spacer and the contact etch stop layer fills a space between the source/drain contact and the first portion of the gate spacer.

17. The semiconductor device of claim 15, wherein the second portion of the gate spacer is disposed between a bottom of the contact etch stop layer and a top of the fin.

18. The semiconductor device of claim 15, wherein the contact etch stop layer includes a first silicon nitride material having the first dielectric constant and the gate spacer includes a second silicon nitride material having the second dielectric constant.

19. The semiconductor device of claim 15, further comprising:
a source/drain contact disposed adjacent the contact etch stop layer, wherein the contact etch stop layer has a third thickness that varies between the first portion of the gate spacer and the source/drain contact.

20. The semiconductor device of claim 15, wherein:
the first portion of the gate spacer has a first height;

the second portion of the gate spacer has a second height; and the second height is less than the first height and the height of the gate spacer is a sum of the first height and the second height.

\* \* \* \* \*